United States Patent
Lenef et al.

(10) Patent No.: US 10,236,658 B2
(45) Date of Patent: Mar. 19, 2019

(54) LIGHT SOURCE UTILIZING WAVELENGTH CONVERSION

(71) Applicants: Alan Lenef, Belmont, MA (US); John Kelso, Exeter, NH (US); Darshan Kundaliya, Beverly, MA (US)

(72) Inventors: Alan Lenef, Belmont, MA (US); John Kelso, Exeter, NH (US); Darshan Kundaliya, Beverly, MA (US)

( * ) Notice: Subject to any disclaimer, the term of this patent is extended or adjusted under 35 U.S.C. 154(b) by 0 days.

(21) Appl. No.: 14/623,016

(22) Filed: Feb. 16, 2015

(65) Prior Publication Data

US 2016/0238203 A1    Aug. 18, 2016

(51) Int. Cl.
| | | |
|---|---|---|
| H01S 5/183 | (2006.01) | |
| F21K 99/00 | (2016.01) | |
| H01S 5/00 | (2006.01) | |
| H01S 5/323 | (2006.01) | |

(52) U.S. Cl.
CPC ............ *H01S 5/0071* (2013.01); *H01S 5/005* (2013.01); *H01S 5/0092* (2013.01); *H01S 5/183* (2013.01); *H01S 5/32341* (2013.01)

(58) Field of Classification Search
CPC ........ F21S 48/12; F21S 48/1225; F21S 48/13; H01S 5/0071; H01S 5/0092; F21K 9/64
USPC .................... 313/501, 502; 362/84
See application file for complete search history.

(56) References Cited

U.S. PATENT DOCUMENTS

| | | | |
|---|---|---|---|
| 7,497,581 B2 | 3/2009 | Beeson et al. | |
| 2007/0081336 A1 | 4/2007 | Bierhuizen et al. | |
| 2007/0187580 A1 | 8/2007 | Kykta et al. | |
| 2010/0084964 A1* | 4/2010 | Groetsch | H01L 33/508 313/502 |
| 2010/0245777 A1 | 9/2010 | Ogura | |
| 2010/0328632 A1 | 12/2010 | Kurosaki et al. | |
| 2011/0148280 A1* | 6/2011 | Kishimoto | F21S 48/1154 313/483 |
| 2011/0205502 A1 | 8/2011 | Kato et al. | |
| 2012/0057364 A1* | 3/2012 | Kishimoto | F21S 48/115 362/538 |
| 2012/0106186 A1* | 5/2012 | Kishimoto | C09K 11/0883 362/510 |
| 2013/0010492 A1 | 1/2013 | Montgomery et al. | |
| 2013/0027962 A1* | 1/2013 | Takahashi | F21S 48/1145 362/538 |

FOREIGN PATENT DOCUMENTS

| | | |
|---|---|---|
| WO | WO 2010/006275 | 1/2010 |
| WO | WO 2010/049875 | 5/2010 |
| WO | WO 2016/012111 | 1/2016 |

* cited by examiner

*Primary Examiner* — Karabi Guharay
(74) *Attorney, Agent, or Firm* — Shaun P. Montana

(57) ABSTRACT

There is herein described a light source comprising a semiconductor device emitting a primary light, a thermally conductive optic having a reflective coating and a wavelength converter having a front surface and a rear surface. The optic is mounted to the rear surface of the wavelength converter and the primary light impinges on the wavelength converter in an emission region. The wavelength converter converts at least a portion of the primary light into a secondary light that is emitted from the front and rear surfaces of the converter and the optic reflects secondary light emitted from the rear surface back into the emission region. The light source may be used in either transmissive or reflective configurations.

19 Claims, 5 Drawing Sheets

LIGHT SOURCE UTILIZING WAVELENGTH CONVERSION

BACKGROUND OF THE INVENTION

Projection and display optics applications usually require light sources with low étendue to efficiently couple into a given optical system or provide a specified beam pattern. One way to accomplish this is by utilizing a laser in combination with a photoluminescent phosphor. This approach may be referred to as laser-activated remote phosphor (LARP) technology. The shorter wavelength primary light from the laser excites (pumps) the phosphor to emit a longer wavelength secondary light (wavelength conversion.) A significant advantage of using wavelength conversion is that the phosphor composition can be chosen so that the system emits a white light. Moreover, such a system can have a much lower étendue than incoherent sources such as high-power light emitting diodes (LEDs).

In LARP applications, the high pump fluxes that are needed to attain a high radiance of converted light from the phosphor have the unintended consequence of locally heating the phosphor in the pump region. This heating reduces the quantum efficiency of the phosphor, and thereby places severe limits on the final radiance of converted light. To address this problem, several approaches have been used. One solution is to use a wavelength converter in the form of a high thermal conductivity ceramic in combination with a high thermal conductivity substrate. Ceramic wavelength converters are formed by sintering a mass of inorganic phosphor particles at high temperature until the particles diffuse and stick together to form a monolithic piece. Typically, the sintered piece has a density that approaches the theoretical density for the material although in some applications it is desirable to maintain some porosity to enhance scattering. Ceramic wavelength converters have a thermal conductivity that is much greater than wavelength converters formed by dispersing individual phosphor particles in a silicone resin.

In the case of transmissive LARP geometries wherein the primary laser light is incident on one side of the wavelength converter and secondary light from the converter is emitted from the opposite side, a sapphire substrate is preferred since the substrate needs to be optically transparent as well as thermally conductive. Transmissive LARP configurations are desirable in many LARP applications because they require fewer optical components and have less complicated optical configurations. This makes them advantageous for applications that require compact LARP sources such as automotive, mobile phone, and other projection/illumination applications.

In order to increase the radiance of the light source, a dichroic reflector may also be added to a transmissive LARP system so that more light is emitted in the forward direction. This may effectively double the radiance of the converted light due to light recycling. However, a dichroic reflector may also have a negative affect on étendue. For example, if the dichroic reflector is placed on the substrate, the recycled secondary light may appear to have a larger effective spot size, increasing source étendue significantly. Even if one could eliminate scattering in the wavelength converter, the recycled light may appear at a different depth-of-field than the forward directed emission, again effectively increasing source étendue.

Another issue that arises when using a ceramic wavelength converter and a transparent substrate is the loss of secondary light that is trapped by total internal reflection (TIR). The fraction of radiation that becomes trapped depends on the relative indices of the substrate and propagation medium and is normally very large. In the case of sapphire-air, only 18% of the emitted radiation will exist within the critical angle cone and exit directly into air. To increase extraction, scattering is required to recycle this radiation, but this will result in an increased source spot size due to the multiple cycles of TIR and scattering into the propagation medium. In the absence of scattering, trapped emission from the wavelength converter will eventually leave through the sides to be lost completely.

SUMMARY OF THE INVENTION

The invention provides a light source that minimizes spot size expansion and TIR trapping for LARP configurations and in particular for transmissive LARP configurations. More particularly, this invention provides a light source with a low étendue for coupling into projection systems and other display optics applications.

While the present invention is especially useful for transmissive LARP configurations, it also has advantages for reflective configurations in which the secondary light is emitted from the same side on which the primary laser pump light is incident. In particular, the present invention permits an external reflector to be used recycle backward directed secondary and primary light and overcomes the technical problems associated with placing a highly reflective and thermally conductive coating directly onto the ceramic wavelength converter surface.

In accordance with an object of the invention, there is provided a light source comprising a semiconductor device emitting a primary light, a thermally conductive optic having a reflective coating and a wavelength converter having a front surface and a rear surface. The optic is mounted to the rear surface of the wavelength converter and the primary light impinges on the wavelength converter in an emission region. The wavelength converter converts at least a portion of the primary light into a secondary light that is emitted from the front and rear surfaces of the converter and the optic reflects secondary light emitted from the rear surface back into the emission region.

In accordance with another object of the invention, the light source has a transmissive configuration whereby primary light from the semiconductor device is transmitted through the optic and directed onto the rear surface of the wavelength converter.

In accordance with a further object of the invention, the light source has a reflective configuration whereby primary light from the semiconductor device is directed onto the front surface of the converter.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

As used herein, a ceramic wavelength converter refers to a solid, sintered polycrystalline photoluminescent material. Ceramic wavelength converters do not include wavelength converters comprising particles of a phosphor material dispersed in an organic or inorganic matrix.

References to the color of a phosphor, LED, laser, or conversion material refer generally to its emission color unless otherwise specified. Thus, a blue LED emits a blue light, a yellow phosphor emits a yellow light and so on.

Figure 1:
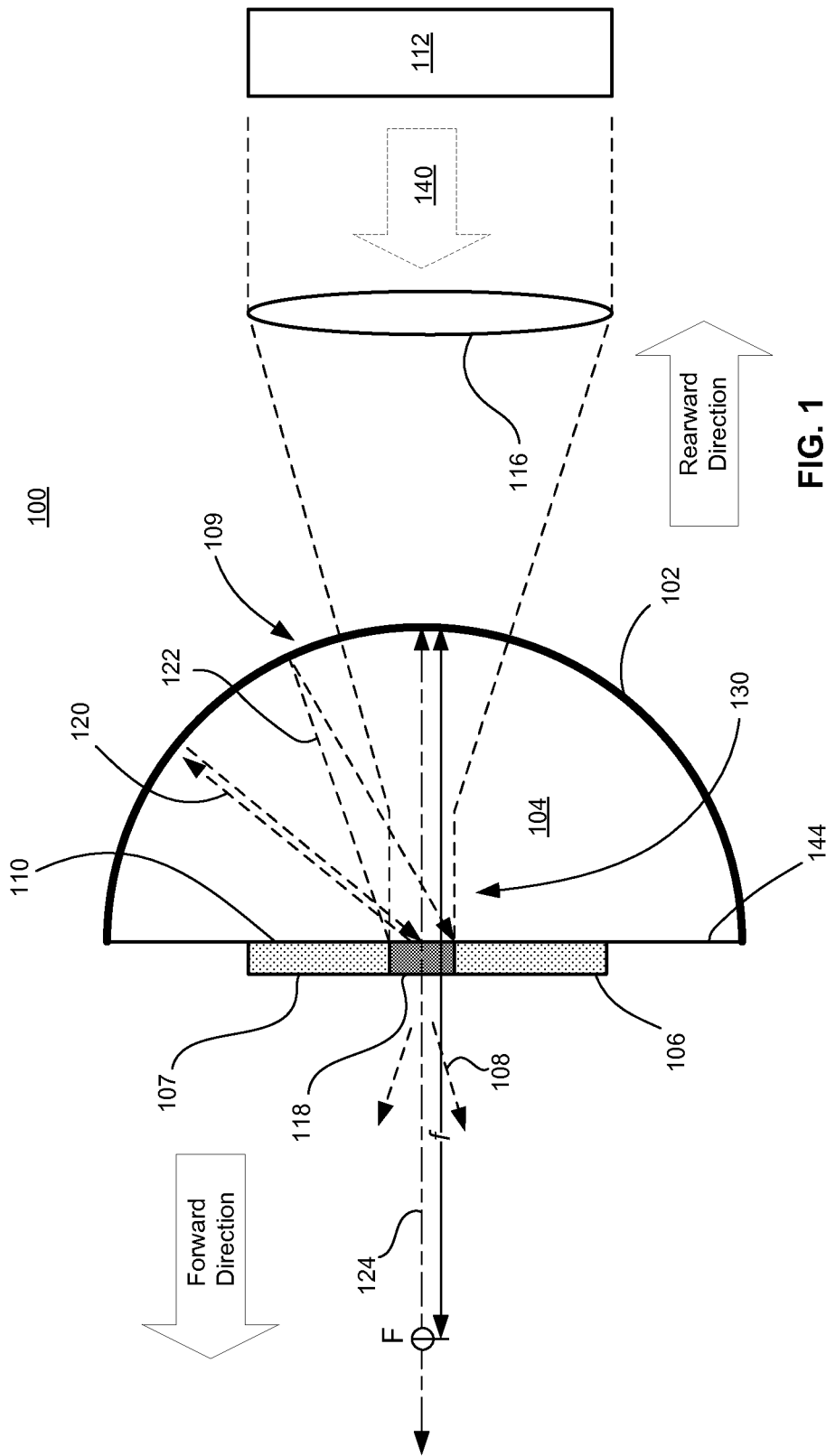
FIG. 1 is a schematic illustration of an embodiment of the light source of this invention in a transmissive configuration.

A first embodiment of a light source 100 in accordance with this invention is shown in FIG. 1 in a transmissive configuration. A semiconductor device 112 emits a beam 140 of primary light. The semiconductor device is a preferably a semiconductor laser, e.g. a vertical-cavity surface-emitting laser (VCSEL), that emits in the blue region of the electromagnetic spectrum. The beam 140 is focused by optional lens 116 onto optic 104. In this embodiment, optic 104 is a hemisphere comprised of a thermally conductive material that is optically transparent. Preferably, the optic is comprised of sapphire, but other thermally conductive, optically transparent materials may be used such as aluminum nitride (AlN), yttrium aluminum garnet (YAG), $Y_2O_3$, doped $ZrO_2$, $MgAl_2O_4$ (spinel), AlON, $SiO_2$, BN, SiC, ZnO or $SnO_2$. Preferably, the thermal conductivity of the optic material is greater than 1 $Wm^{-1}K^{-1}$ and more preferably greater than 10 $Wm^{-1}K^{-1}$. The optic 104 is bonded to rear surface 110 of ceramic wavelength converter 106. In this embodiment, converter 106 is a ceramic wavelength converter that preferably has the form of a flat disc or rectangle. The converter 106 is comprised of a phosphor which converts the primary light emitted by the semiconductor device 112 into secondary light having a different wavelength. Preferably, the phosphor is a cerium-activated garnet phosphor which may be represented by the formula $A_3B_5O_{12}$:Ce, wherein A is Y, Sc, La, Gd, Lu, or Tb and B is Al, Ga or Sc. More preferably, the phosphor is at least one of $Y_3Al_5O_{12}$:Ce, $(Y,Gd)_3Al_5O_{12}$:Ce, and $Lu_3Al_5O_{12}$:Ce. To achieve a wide range of color coordinates or spectral content for the wavelength converter, other phosphors may be used including barium magnesium aluminates, nitrides, and oxynitrides, which may be doped with other rare-earth ions including $Eu^{2+}$, $Pr^{3+}$ and $Dy^{3+}$. The ceramic wavelength converter may be formed by a number of conventional ceramic-forming techniques including mixing the phosphor particles with an organic binder, molding the desired shape, and burning out the organic binder followed a final high-temperature sinter to form a monolithic piece.

Primary light from semiconductor device 112 impinges upon wavelength converter 106 where it is converted into secondary light within emission region 118. The extent of emission region 118 on the front surface 107 of converter 106 forms the source spot which may be coupled into for example a projection system. The emission of secondary light within the emission region 118 is generally isotropic causing at least some secondary light to be emitted from the rear surface 110 of converter 106 as well as from the front surface 107. In order to increase the amount of secondary light emitted from the front surface 107 and improve the efficiency of the light source 100, the curved surface 109 of the hemispherical optic 104 has a reflective coating 102 that reflects the secondary light emitted from the rear surface 110 back into the emission region 118. As this embodiment is a transmissive configuration, the reflective coating 102 must also be able to allow primary light from the semiconductor device 112 to pass through into optic 104. Thus in this configuration reflective coating 102 is comprised of a dichroic coating that reflects the longer wavelength secondary light, but transmits the shorter wavelength primary light. The emitted secondary light then appears in the forward direction, along with unabsorbed primary light. Alternatively, a highly reflective coating such as an enhanced metal coating could be applied to optic 104 to provide better wide angle reflectivity over a large spectral range while only the region where the primary light beam 140 is incident on optic 104 may require a dichroic coating which could have weaker angular requirements, allowing for expanded spectral range. The metallization would also permit the hemispherical optic to be soldered or metal bonded directly to a heat sink with a similarly shaped cavity for optimal heat conduction. In the case of a reflective configuration, a complete coating of the hemisphere by either a highly reflective metalized coating or broadband dielectric coating (including both primary and secondary light wavelengths) would be appropriate (e.g., FIG. 4.)

The wavelength converter 106 is approximately centered on a plane that cuts through the center point of the hemisphere. The presence of the reflective coating 102 on hemispherical optic 104 essentially forms a hemispherical mirror with a principal axis 124 with its center of curvature located in the emission region 118. Secondary light rays 120 that are emitted from the rear surface 110 at the center of the emission region 118 (i.e., near the center of curvature on principal axis 124) retro-reflect from the reflective coating 102 back to the same point. Secondary light rays 122 that are emitted from the emission region 118 from off-axis points, reflect back to their mirror image point on the emission region 118, provided the angle is not too steep. This occurs because the focal length of a hemispherical mirror is R/2, where R is the radius of curvature, implying a 1:1 magnification, but with the image inverted. Rays emitted at steeper angles and off-axis will not always return to the emission region 118 of the converter 106 because of aberrations. Nonetheless, this arrangement should provide a near two-fold increase in the radiance of the light source from light recycling.

As a further advantage, the desired forward-directed secondary light 108 comes directly from the wavelength converter without passing through additional elements such as a substrate. With the appropriate volume scattering or surface-structured features, light extraction may approach 100% with ceramic wavelength converters. In the case of thin-film wavelength converters, a small amount of bulk or surface scattering may also provide close to 100% extraction efficiency. By applying a strong engineered surface scattering layer to the thin-film wavelength converter, a partial conversion LARP phosphor assembly may be realized with minimal color variation with far-field angle. Furthermore the final source spot size of the light source 100 is determined precisely by the area of the emission region 118 on the front surface 107 of converter 106, which provides for a low source étendue. In the case of thin-film conversion or transparent ceramic converters, the smallest source spot size may be realized because low volume scattering implies minimal spot spreading due to lateral scattering.

An additional aspect of this embodiment is the strong focusing of the primary light by the hemispherical optic 104. This can be used to obtain as small a spot size as possible by matching the focal point of the lens 116 to the center point of the hemispherical optic 104. Once matched, focused primary light rays can enter the hemisphere without refraction; the primary light spot size will be limited by diffraction, as indicated by the collimated Rayleigh region 130. Alternatively, one can also use the hemisphere to provide focusing power, reducing the focusing power required for external primary light optics. In this case, one can approximately treat the hemisphere as a lens with a focal point F located at a distance f from the curved surface 109 of the hemisphere. For near paraxial rays, the focal distance is given by $$f \cong R \frac{n}{n-1}. \quad (1)$$

Thus, one can adjust the focal lengths and distances of external lenses and other optics to achieve a desired spot size and distribution on the wavelength converter. This allows one to achieve a good compromise between desired primary light spot size and maximum primary light intensity resulting in an optimal source étendue for the highest achievable source radiance before thermal quenching limits are reached. This configuration also permits direct pumping by partially collimated laser diodes from different directions, simplifying beam combining elements normally required in LARP configurations pumped by multiple laser diodes.

Figure 2:
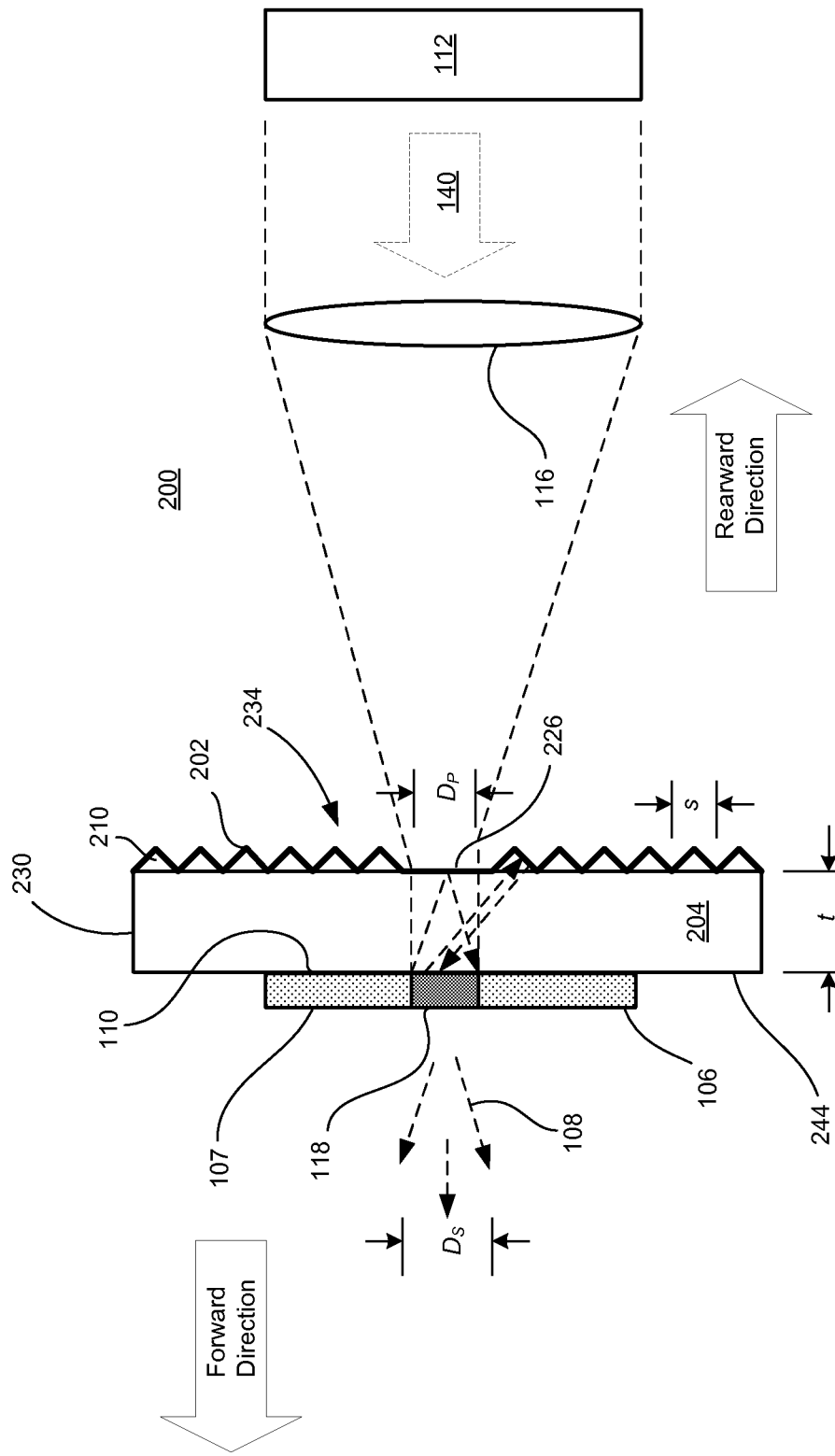
FIG. 2 is a schematic illustration of another embodiment of the light source of this invention in a transmissive configuration.

A second embodiment of the invention is shown in FIG. 2. The basic configuration of light source 200 is similar to the transmissive configuration shown in FIG. 1. A beam of primary light 140 emitted by semiconductor device 112 is focused by lens 116 onto thermally conductive optic 204. The primary light passes through optic 204 to impinge on the rear surface 110 of wavelength converter 106 which is bonded to optic 204. The converter 106 converts at least a portion of the primary light into secondary light having a different wavelength. Preferably, the optic 204 is comprised of an optically transparent material such as sapphire so as not to scatter either primary or secondary light. In this embodiment, optic 204 has body 230 in the form of a flat plate of thickness, t, and has a patterned surface 234 which faces semiconductor device 112. The patterned surface 234 comprises a 2D array of corner-cube reflectors 210 for retro-reflecting rearward directed light back in the forward direction. The optic 204 may be fabricated by several methods, including laser machining, grinding, etching or other methods for making shapes in ceramic materials. The optic 204 with the cube-corner array could also be made of molded transparent polycrystalline ceramics such as YAG, and nano-grained alumina. Such materials have the advantage of fabrication by molding processes. The array of corner-cube reflectors 210 may also be a separate molded part; however the molded material must closely match the refractive index of body 230 and must be bonded to body 230 by a similarly index-matched material. The bonding material could also be of a different refractive index, provided the bond line thickness is much less than one wavelength to permit strong evanescent coupling and minimal TIR at the interface of the body and cube-corner array.

Figure 3:
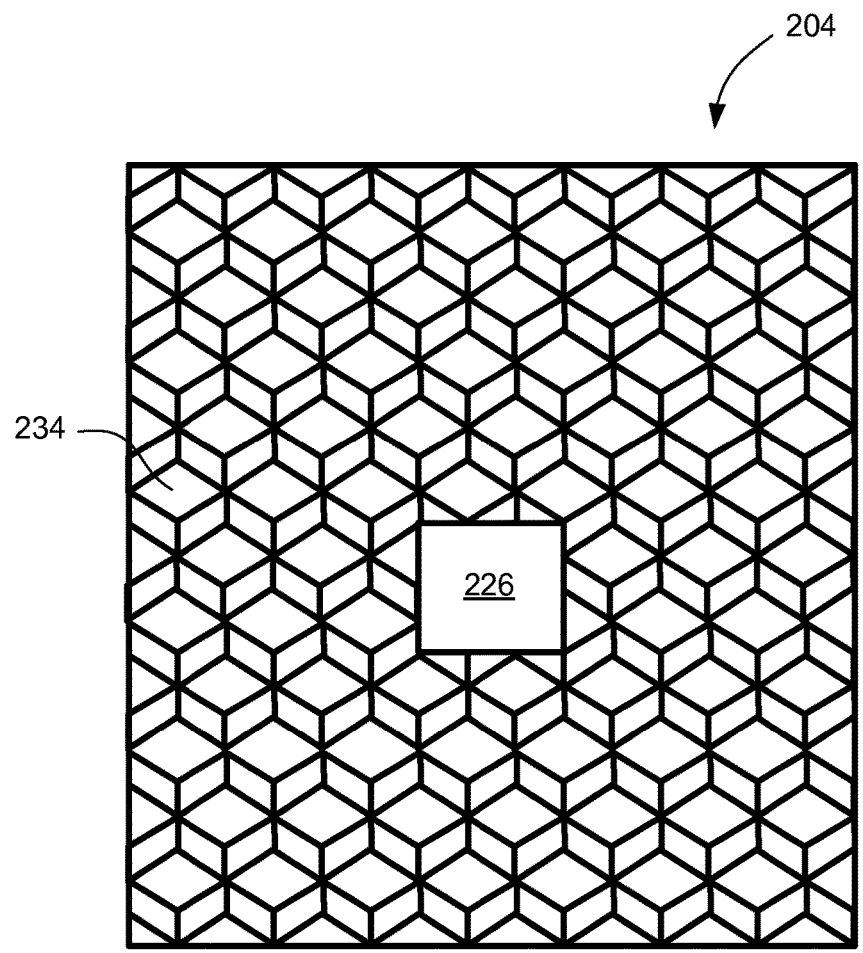
FIG. 3 is a top view of the patterned surface of the optic of the embodiment shown in FIG. 2.

The outer surfaces of the corner cubes are coated with a reflective coating 202 which reflects at least the secondary light emitted by converter 106. In this embodiment, the reflective coating 202 is a dichroic coating that transmits primary light while reflecting secondary light. Flat region 226 which is centered on the patterned surface 234 is slightly larger than the area of the incident primary light beam 140 and is free of corner-cubes to permit proper focusing or imaging onto converter 106. This may be better seen in FIG. 3 which shows a top view of patterned surface 234. Flat region 226 is also coated with reflective coating 202. The corner-cube surfaces should be at a 45 degree angle with respect to the plane of the surface of body 230. Preferably, the array should consist of contiguous corner-cubes with negligible space between corner-cubes. It is preferred that the array have an optical polish smoothness of better than $\lambda/2$, and preferably less than $\lambda/5$. For fabrication purposes, applying a single dichroic coating across the entire patterned surface 234 is most desirable.

The purpose of the corner-cube array is to retro-reflect rearward emitted secondary light rays from converter 106 back in the same direction from which they came. Corner cubes have the property that they will retro-reflect light at any angle. The reflected beam is shifted laterally on the order of the corner-cube size. Thus, this embodiment recycles the rearward emitted secondary light to the forward direction with only a small increase in spot size. If the incident primary light spot (pump spot) diameter, $D_p$, is chosen such that it just fits into the flat region 226, rearward directed radiation from emission region 118 (including either scattered primary or secondary light) can be reflected by dichroic-coated flat region 226 outside the pump spot, possibly expanding the spot to as much as, but no more than, $3D_p$. However, this radiation will be a small fraction of the total rearward directed radiation. The larger the ratio of $t/D_p$ the smaller the solid angle of rearward emitted rays which reflect from the flat dichroic-coated region. More specifically, if $t \gg D_p$, the fraction of radiation incident on the flat region is approximately $(D_p/2t)^2$ which can be much less than one. The rest of the radiation will be incident on the corner-cube elements. At most, the radiation incident on the corner-cube elements will be displaced by s, which is the pitch of the array. For example if $D_p=250$ µm and the pitch s=25 µm, then the spot expansion would be at most $D_p+2$ s=300 µm. Preferably, for this embodiment $t > D_p$ and $s \ll D_p$. More preferably $D_p$ is at least 5 s, and even more preferably $D_p$ is at least 10 s. The expansion of the recycled spot will actually be a distribution superimposed on the final emission spot diameter of $D_s$, where the emission spot is already larger than the pump spot $D_p$ due to scattering. Thus, the fraction of recycled radiation within the emission spot may even be greater.

Other possible optics for the light source of this invention include a free-form optical surface that may be used to optimize the recycled spot distribution and/or pump focusing. Diffractive structures such as 2D photonic lattices may also be used to provide engineered retro-reflection profiles. Such anomalous reflection can be engineered with sub-wavelength inhomogeneous arrays of optical antennas or other meta-material structures. Also, this invention is not limited to transmissive applications. One could use this approach for a reflective configuration by coating the optic with a fully reflective coating and reversing the direction of the primary light beam by placing the semiconductor device in front of the converter such that the primary light beam shines directly onto the converter. Examples of such reflective configurations are shown in FIGS. 4 and 5.

Figure 4:
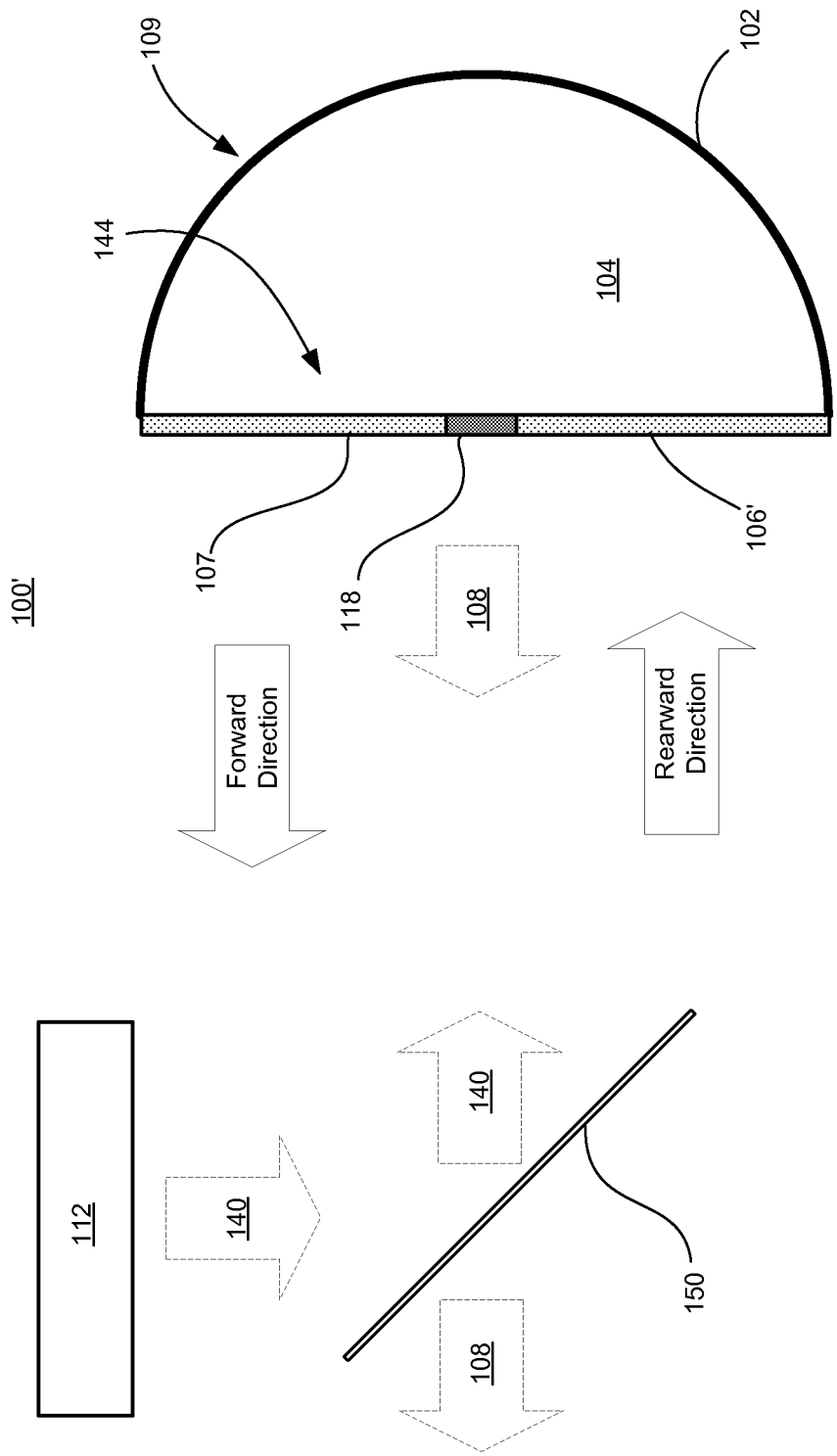
FIG. 4 is a schematic illustration of a further embodiment of the light source of this invention in a reflective configuration using a hemispherical optic similar to the one shown in FIG. 1.

With reference to FIG. 4, there is shown an embodiment of the light source according to this invention in a reflective configuration. The light source 100' employs a hemispherical optic 104 as in FIG. 1. However, in this embodiment, the semiconductor device 112 is placed in front of the converter 106' in an off-axis position that does not interfere with the forward-directed secondary light 108 emanating from emission region 118. The primary light beam 140 emitted semiconductor device 112 is directed onto converter 106' by reflecting the beam 140 off dichroic beam splitter 150. The dichroic beam splitter 150 transmits the forward-directed secondary light 108 allowing it to be collected/focused for use in a projection system, fiber optic, etc. Reflective coating 102 on the curved surface 109 of hemispherical optic 104 may be fully reflective in this configuration since there is no need to transmit the primary light beam 140 as in a transmissive configuration (FIG. 1.) Preferably, reflective coating 102 is a highly reflective metal coating such as a silver coating. Rearward-emitted secondary light is retro-reflected by reflective coating 102 of optic 104 back into emission region 118 thereby increasing the intensity of the forward-directed secondary emission.

The converter 106' in this embodiment has the form of a thin phosphor film that has been deposited on the flat surface 144 of the hemispherical optic 104. Preferably, the film extends over the entire flat surface 144 and has a thickness less than 20 micrometers. The thin-film phosphor converter 106' may be deposited by a variety of methods including pulsed-laser deposition (PLD), sputtering, ion-beam, CVD, MOCVD. These methods may also allow use of conversion materials such as GaN, ZnO, and a variety of other semiconductor materials that require an epitaxial film and may allow excitation in the UV and emission in the visible.

Figure 5:
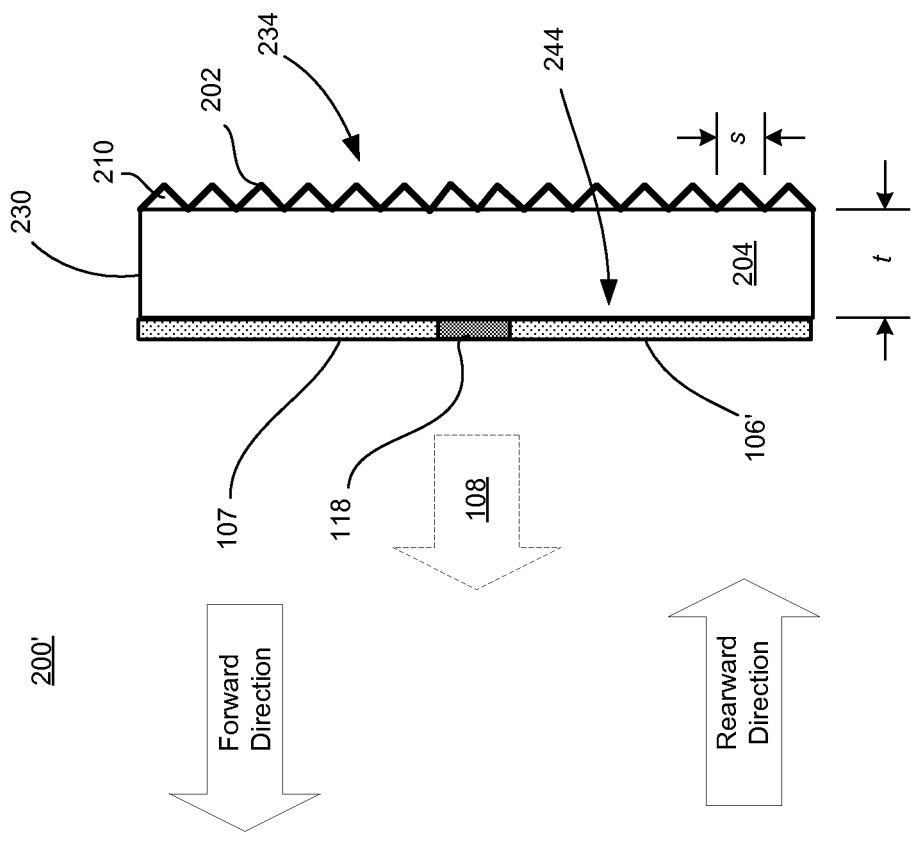
FIG. 5 is a schematic illustration of yet another embodiment of the light source of this invention in a reflective configuration using an optic similar to the one shown in FIG. 2.
Figure 5:
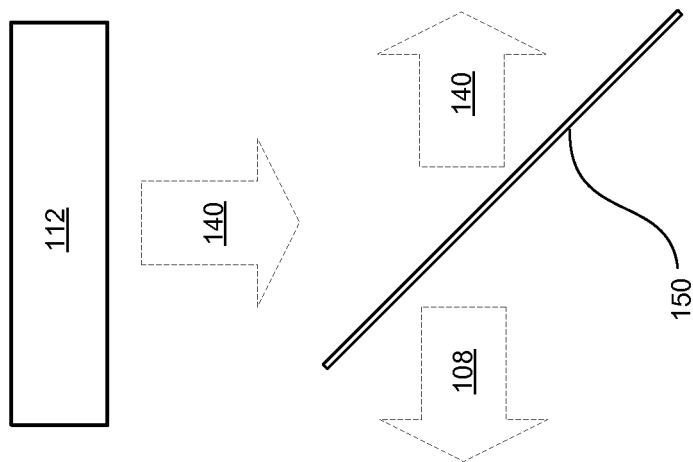

FIG. 5 is another embodiment of the light source according to this invention in a reflective configuration. As in FIG. 4, semiconductor device 112 is placed in front of converter 106' in an off-axis position so as not to interfere with the forward-directed secondary light 108. Similar to FIG. 2, light source 200' employs an optic 204 having a patterned surface 234 which comprises a 2D array of corner-cube reflectors 210. However, unlike the embodiment in FIG. 2, there is no flat region 226 in the center of the patterned surface 234 since the primary light beam 140 impinges on the front surface 107 of converter 106'. Converter 106' is a thin-film phosphor that has been deposited on the flat front surface 244 of optic 204 and extends over the entire front surface 244. As in FIG. 2, rearward-emitted secondary light is retro-reflected back into emission region 118 by reflective coating 202 of optic 204 thereby increasing the intensity of the forward-directed secondary light emission.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light source, comprising:
a semiconductor device emitting a primary light;
a thermally conductive optic having a reflective coating; and
a wavelength converter having a front surface and a rear surface, the optic being mounted to the rear surface of the wavelength converter, the rear surface of the wavelength converter positioned closer to the semiconductor device relative to the front surface of the wavelength converter,
the primary light impinging on the wavelength converter in an emission region,
the wavelength converter converting at least a portion of the primary light into a secondary light that is emitted from the front and rear surfaces of the converter, the optic reflecting secondary light emitted from the rear surface back into the emission region,
wherein the optic is a hemispherical optic having a flat surface and a curved surface, the reflective coating being located on the curved surface and the converter being mounted to the flat surface,
wherein the light source has a transmissive configuration whereby primary light from the semiconductor device is transmitted through the optic and directed onto the rear surface of the wavelength converter,
wherein the reflective coating is a dichroic coating that reflects secondary light emitted from the rear surface of the converter and transmits primary light emitted by the semiconductor device.

2. The light source of claim 1 wherein the hemispherical optic forms a hemispherical mirror with a principal axis and a center of curvature location in the emission region.

3. The light source of claim 1 wherein the optic is comprised of sapphire.

4. The light source of claim 1 wherein the optic is comprised of a material selected from aluminum nitride (AlN), yttrium aluminum garnet (YAG), Y2O3, doped ZrO2, MgAl2O4 (spinel), AlON, SiO2, BN, SiC, ZnO or SnO2.

5. The light source of claim 1 wherein the converter is a ceramic wavelength converter.

6. The light source of claim 5 wherein the ceramic wavelength converter is comprised of a cerium-activated garnet phosphor having a formula A3B5O12:Ce, wherein A is Y, Sc, La, Gd, Lu, or Tb and B is Al, Ga or Sc.

7. The light source of claim 1 wherein the converter is a thin-film phosphor.

8. A light source, comprising:
a semiconductor device emitting a primary light;
a thermally conductive optic having a reflective coating; and
a wavelength converter having a front surface and a rear surface, the optic being mounted to the rear surface of the wavelength converter, the front surface of the wavelength converter positioned closer to the semiconductor device relative to the rear surface of the wavelength converter,
the primary light impinging on the wavelength converter in an emission region,
the wavelength converter converting at least a portion of the primary light into a secondary light that is emitted from the front and rear surfaces of the converter, the optic reflecting secondary light emitted from the rear surface back into the emission region,
wherein the optic is a hemispherical optic having a flat surface and a curved surface, the reflective coating being located on the curved surface and the converter being mounted to the flat surface, an entirety of the optic positioned on a side of the wavelength converter adjacent the rear surface such that the curved surface of the optic is positioned closer to the rear surface than the front surface of the wavelength converter wherein the light source has a reflective configuration whereby primary light from the semiconductor device is directed onto the front surface of the converter.

9. The light source of claim 8 wherein the reflective coating is a highly reflective metal coating.

10. A light source, comprising:
a semiconductor device emitting a primary light;
a thermally conductive optic having a reflective coating; and
a wavelength converter having a front surface and a rear surface, the optic being mounted to the rear surface of the wavelength converter,
the primary light impinging on the wavelength converter in an emission region,
the wavelength converter converting at least a portion of the primary light into a secondary light that is emitted from the front and rear surfaces of the converter, the optic reflecting secondary light emitted from the rear surface back into the emission region, wherein the optic has a body in the form of a flat plate, the body having a flat front surface and a patterned surface comprising a two-dimensional array of corner-cube reflectors, the reflective coating being located on patterned surface and the converter being mounted on the flat front surface,
wherein the body of the optic has a thickness t, the array has a pitch s, and the primary light forms a pump spot of diameter Dp wherein t>Dp and Dp is at least 5s.

11. The light source of claim 10 wherein the corner-cube reflectors are integrally formed with the optic.

12. The light source of claim 10 wherein Dp is at least 10s.

13. The light source of claim 10 wherein the light source has a transmissive configuration whereby primary light from the semiconductor device is transmitted through the optic and directed onto the rear surface of the wavelength converter.

14. The light source of claim 13 wherein the optic has a flat region centrally located in the patterned surface to receive the primary light.

15. The light source of claim 14 wherein the flat region is slightly larger than a pump spot formed by the primary light.

16. The light source of claim 13 wherein the reflective coating is a dichroic coating that reflects secondary light emitted from the rear surface of the converter and transmits primary light emitted by the semiconductor device.

17. The light source of claim 10 wherein corner-cube reflectors have surfaces at a 45 degree angle with respect to a plane of a surface of the body.

18. The light source of claim 10 wherein the light source has a reflective configuration whereby primary light from the semiconductor device is directed onto the front surface of the converter.

19. The light source of claim 18 wherein the reflective coating is a highly reflective metal coating.

* * * * *